United States Patent [19]

Pinkahsov

[11] Patent Number: 4,924,135
[45] Date of Patent: May 8, 1990

[54] ELECTRODE FOR VAPOR DEPOSITION AND VAPOR-DEPOSITION METHOD USING SAME

[75] Inventor: Eduard Pinkahsov, Eastchester, N.Y.

[73] Assignee: Vapor Technologies Inc., Mt. Vernon, N.Y.

[21] Appl. No.: 220,549

[22] Filed: Jul. 18, 1988

[51] Int. Cl.⁵ .......................... H01J 1/13; H01J 17/26; H01J 61/28
[52] U.S. Cl. .................................... 313/326; 313/352; 313/357; 313/231.41; 313/350
[58] Field of Search ............... 313/326, 332, 345, 352, 313/355, 357, 231.41

[56] References Cited

U.S. PATENT DOCUMENTS 3,461,339 8/1969 Robiette .............................. 313/326
4,002,940 1/1977 Ekkelboom et al. ........... 313/350 X Primary Examiner—Sandra O'Shea
Attorney, Agent, or Firm—Herbert Dubno

[57] ABSTRACT

Thermal breakage of crystalline electrodes used in arc-vapor deposition is prevented by originally fabricating the electrodes from broken pieces of the crystalline material which are slightly sintered together and form an electrode body in which a carbon rod or other conductor is embedded to provide electrical contact. The particles are sintered in a vacuum oven and a pool of the electrode material can be formed at a working end of the electrode body when the latter is used for arc-vapor deposition.

4 Claims, 1 Drawing Sheet

ELECTRODE FOR VAPOR DEPOSITION AND VAPOR-DEPOSITION METHOD USING SAME

CROSS-REFERENCE TO RELATED APPLICATIONS

This application is related to my copending application Ser. No. 06/941,185 filed 12 Dec. 1986 now U.S. Pat. No. 4,828,934 issued 5/9/89 and also relates to subject matter disclosed in prior applications linked to said copending application and which have matured into U.S. Pat. Nos. 4,351,855, 4,438,153, 4,505,948, 4,537,794, 4,548,670, 4,565,711, 4,569,307 and 4,575,401.

FIELD OF THE INVENTION

My present invention relates to an electrode for use in arc-vapor deposition and, more particularly, to an electrode composed of a material which is frangible by thermal shock, particularly, monocrystalline electrode materials. The invention also relates to a vapor deposition method utilizing such electrodes and to a method of making such electrodes.

BACKGROUND OF THE INVENTION

In the aforementioned patents and application, I have described the arc-vapor deposition of metals on a substrate, whereby an electric arc is struck between two electrodes, at least one of which can comprise silicon which may ultimately be incorporated in the material to be deposited on the substrate. The arc is struck by approaching one of the electrodes to the other until contact is substantially established, whereupon the electrodes are separated so that an arc is generated between them and causes the evaporation of the material from the one electrode so that this material in the elemental or compound state in which it was originally found in the electrode, is deposited upon the substrate or can undergo reaction with gaseous components in the evacuated space in which the vaporization takes place, or reaction with metal of the other electrode, to deposit as part of a compound or alloy upon the substrate.

In accordance with these principles, a relatively high vacuum is maintained in the region at which the arc is struck and which has been juxtaposed with the substrate. The arc is controlled and striking is repeated to provide reproducible conditions at an appropriate rate.

The silicon can be deposited in elemental form or as a compound and for many purposes, it is desirable or essential to use high purity silicon as a source of the material to be deposited.

When, however, monocrystalline silicon electrodes are fabricated for this purpose, i.e. for vapor deposition of elemental silicon or compound such as silicon carbide or silicon nitride, it is found that the thermal shock resulting from arc striking causes cracking and rupture of the highly frangible material. The phenomenon is equally noticeable with certain other crystalline materials, namely silicon carbide and silicon nitride.

It is, therefore, a drawback of the earlier described systems that deterioration of the electrode, a relatively high-cost item for the process, occurs and is most pronounced when such crystalline materials are the electrode materials of choice.

OBJECTS OF THE INVENTION

It is, therefore, the principal object of the present invention to provide an improved electrode for arc-vapor deposition processes which does not suffer the aforedescribed drawbacks.

Another object of this invention is to provide an improved method of making an electrode for arc-vapor deposition.

It is yet another object of this invention to provide an improved method of making the new electrode of this invention.

SUMMARY OF THE INVENTION

I have discovered, quite surprisingly and quite in contrast to previous beliefs in the art of fabricating electrodes for electrical processes, that the aforedescribed disadvantages can be eliminated when the electrode is constituted of lightly sintered macroparticles of the electrode material bonded to a conductive shank by which the electric current can be delivered to the electrode body consisting of the sintered particles. The sintered particles should be coarsely-broken crystalline particles, e.g. of silicon but also silicon carbide or silicon nitride, for example, which may be bonded to or in electrical contact with a carbon or metal rod or shank forming the conductive element making electrical contact with the body. According to the invention, an electrode body is fabricated which should have a density of at most 70% of the density of the solid material.

Preferably, the body widens from its active end toward an end from which the shank projects and the formation of the arc is carried out in such manner that the active end of the body forms a cup of the fused electrode material in which a pool of the molten electrode material can form.

While I am not certain as to all of the reasons why the electrode of the invention does not suffer the frangibility problems previously encountered with solid crystal electrodes, while being subjected to the same thermal shock, I believe that the reason is the limited number of fusion bridges between the particles in the lightly sintered mass so that the heat transfer away from the active surface is minimized although the bridges are sufficient in number to provide the requisite electrical conductivity.

Preferably, the electrode material is crystalline silicon or silicon carbide or silicon nitride, the porosity of the electrode body is such that the electrode body has a density of 50 to 60% of its solid density and the particles range in size from substantially 2 to substantially 15 mm.

It has been found to be advantageous in the fabrication of such an electrode, to place the particles of the crystalline electrode material in a form composed of a refractory material, e.g. alumina, in alternating layers of fine and coarse particles, around a graphite or other carbon rod serving as the conductor shank and to sinter the mass within the form without the application of mechanical pressure to the mass.

In particular, I have found it to be advantageous during the process to initially raise the temperature of the mass gradually, preferably over a period of 40 to 50 minutes to a temperature of about 600° C., thereafter raising the temperature at a rate of 25° C. to 50° C. per minute to the ultimate sintering temperature of between 1280° C. and 1400° C., preferably around 1375° C., the temperature being held at the sintering temperature for about 15 minutes to obtain a limited fusion bonding or bridges between particles without significant densification of the mass.

In use, the electrode may be employed in the arc-vapor deposition process described in the above-identified application and my earlier patents as mentioned above.

BRIEF DESCRIPTION OF THE DRAWING

The above objects, features and advantages of my invention will become more readily apparent from the following description, reference being made to the accompanying drawing in which.

SPECIFIC DESCRIPTION

Figure 1:
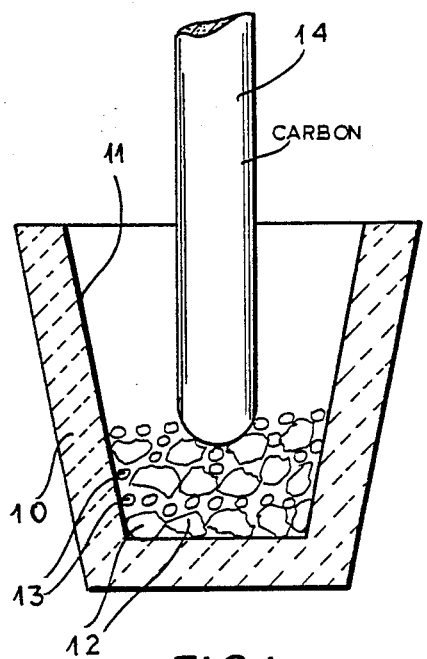
FIG. 1 is a cross-sectional view illustrating the fabrication of an electrode in accordance with the present invention.

In FIG. 1 of the drawing, I have shown an alumina form 10 having a conical interior 11 in which an electrode 20 (FIG. 2) is to be fabricated. Into this form, in respective layers, broken coarse pieces 12 and broken fine pieces 13 of a monocrystalline or polycrystalline electrode material are introduced around a carbon rod 14 which will ultimately form the electrically conductive element connected to the electrode body. The electrode body is formed by sintering the particles in the form in a vacuum oven as described.

The electrode 20 which thus results then comprises an electrode body 21 in which the coarse particles 12 and the fine particles 13 are lightly sintered together into a coherent mass which is significantly less susceptible to thermal shock than a solid monocrystalline or polycrystalline electrode of equivalent material.

Figure 2:
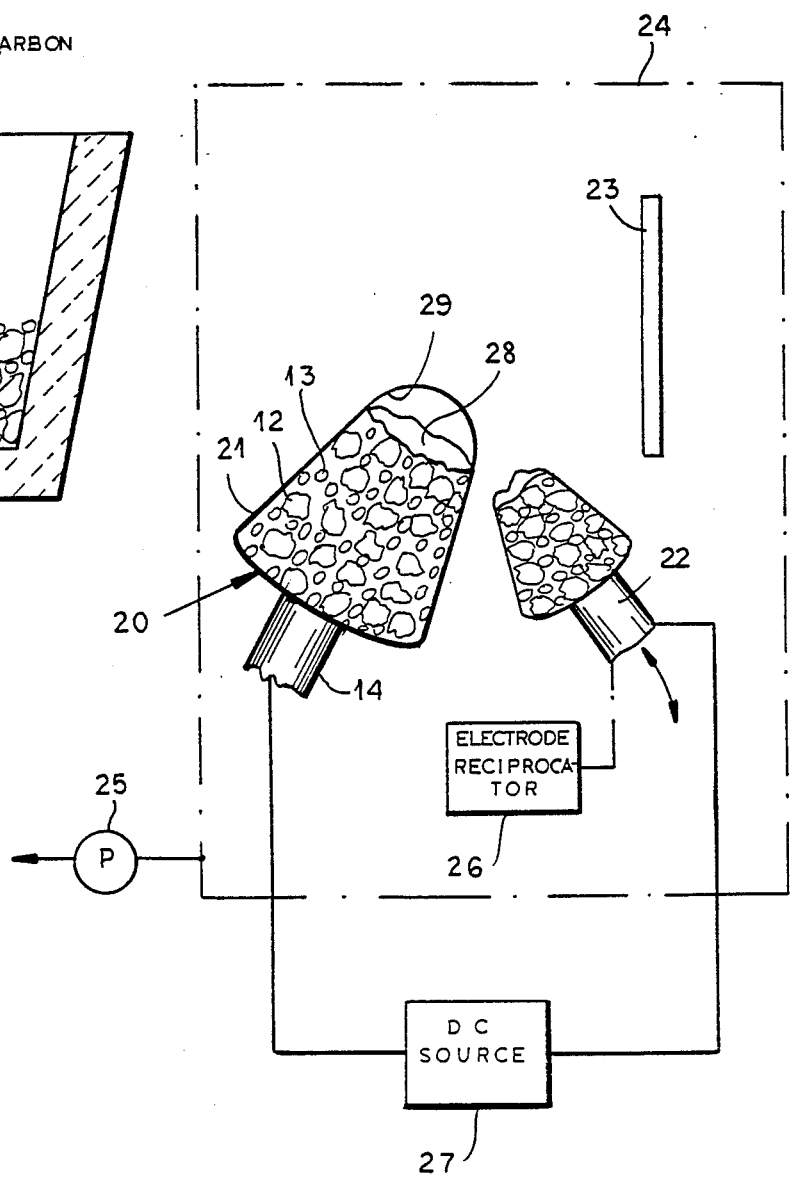
FIG. 2 is a diagrammatic elevational view illustrating an apparatus for carrying out an arc-vapor deposition process with that electrode.

The electrode can be used in an arc-vapor deposition process as described in FIG. 2. In particular, it can be juxtaposed with an identically fabricated electrode 22 of, for example, silicon where a high purity silicon deposit is desired, or silicona nd chunks of silicon carbide where silicon carbide or mixtures of silicon and silicon carbide are to be deposited on the substrate 23. The electrodes are provided within an enclosure 24 which is evacuated as represented by the pump 25 to a vacuum level of the type described in the aforementioned application and patents for coating.

The electrode 22 is reciprocated by a drive 26 into and out of contact with the electrode 20 while an arc source 27 is connected across the electrodes so that a pool of molten electrode material 28 is formed in the cup-like cavity 29 which develops at the narrow active end of the conical electrode body. The formation of vapor and its deposition upon the substrate 23 is fully described in the aforementioned patents and application. In particular, the arc must be struck by intermittently contacting the electrode 22 with the pool in the electrode 20 or by contacting the electrode 22 with the body 21. Furthermore, the arc is quenched by the successive arc striking contacts thereby controlling the movement of the arc along the electrode body 21. This ensures that the arc will be conformed to the cup region 29 and will not progress to the larger end of the electrode or to the conductive shank 14.

The vacuum in the chamber 24 is maintained at $10^{-3}$ torr or better (i.e. the pressure rises no higher than $10^{-3}$ torr) during the coating operation and the arc is struck with a voltage of 30 to 150 V utilizing a current of 30 to 100 amperes.

SPECIFIC EXAMPLE

Into an alumina vessel having generally the shape of the vessel 10 shown in FIG. 1 and a cavity volume of 250 ml broken monocrystalline silicon is placed in layers of a partial size between substantially 3 and 13 mm. A carbon electrode rod is inserted into the mass as shown.

The mass is sintered in a vacuum oven at a vacuum $10^{-5}$ to $10^{-6}$ torr by initially raising the temperature to 600° C. over 40 minutes and then rapidly bringing the temperature to 1375° C. at a rate of 50° C. per minute. The mass is held at the sintering temperature of 1375° C. for 15 minutes. The electrode body is found to be easily removable from the crucible and to have a density of 50 to 60% of that of solid silicon. Two such electrode bodies are used as the electrodes 20 and 22 in the arc-vapor deposition of silicon on a substrate. The vacuum in the vacuum chamber is at $10^{-5}$ torr and maintained at this level or better throughout a vapor deposition. The electrode body is composed of silicon and is fabricated as described.

The substrate 23 is an aluminum plate which has previously been sandblasted on its surface to be coated. The arc-striking rate is approximately one per second, the substrate is placed at about 15 cm from the arc and a current of about 90 amperes is drawn at a voltage of about 90 V. The coating is highly coherent and is found to consist of silicon.

Other materials to be incorporated in the deposit can be placed in the cup provided at 29. For example, I have found that when two silicon electrodes are used, one can deposit silicon carbide or boron carbide in the cup for vaporization and deposit silicon carbide or boron carbide upon the substrate together with the silicon from the electrode material itself. Naturally, one can provide a nitrogen atmosphere in the enclosure so that deposits of nitrides can be formed on the substrate.

I claim:

1. An electrode for use in arc-vapor deposition which comprises:

an electrode body consisting essentially of slightly sintered coarse pieces of an electrode material, said electrode body being sintered together to a density of at most 70% of the density of the electrode material in a continuous solid form; and a shank of a material of high conductivity different from said electrode material and extending into said body.

2. The electrode defined in claim 1 wherein said electrode material is a crystalline metal.

3. The electrode defined in claim 1 wherein said electrode material is selected from the group which consists of silicon, silicon carbide and silicon nitride.

4. The electrode defined in claim 1 wherein said electrode is generally frustoconical and has a narrow end and a wide end, said shank projecting from said wide end.

* * * * *